United States Patent

Bárdos et al.

[11] Patent Number: 5,908,602
[45] Date of Patent: Jun. 1, 1999

[54] APPARATUS FOR GENERATION OF A LINEAR ARC DISCHARGE FOR PLASMA PROCESSING

[75] Inventors: Ladislav Bárdos; Hana Baránkova, both of Uppsala, Sweden

[73] Assignee: Surfcoat Oy, Mikkeli, Finland

[21] Appl. No.: 08/836,708

[22] PCT Filed: Oct. 20, 1995

[86] PCT No.: PCT/SE95/01248

§ 371 Date: May 19, 1997

§ 102(e) Date: May 19, 1997

[87] PCT Pub. No.: WO96/16531

PCT Pub. Date: May 30, 1996

[30] Foreign Application Priority Data

Nov. 18, 1994 [SE] Sweden .................................. 9403988

[51] Int. Cl.⁶ .................................................. B01J 19/12
[52] U.S. Cl. .................... 422/186.03; 422/186.05
[58] Field of Search ........................ 422/186.05, 186.03

[56] References Cited

U.S. PATENT DOCUMENTS

| | | |
|---|---|---|
| 3,562,141 | 2/1971 | Morley . |
| 4,521,286 | 6/1985 | Horwitz . |
| 4,767,641 | 8/1988 | Kieser et al. . |
| 5,019,117 | 5/1991 | Nakamura et al. ............. 118/723 |
| 5,185,132 | 2/1993 | Horiike et al. ............... 422/186.05 |
| 5,279,723 | 1/1994 | Falabella et al. . |

FOREIGN PATENT DOCUMENTS

| | | |
|---|---|---|
| 246982 | 10/1987 | Czechoslovakia . |
| 3925 | 8/1990 | Czechoslovakia . |
| 297637 | 11/1982 | European Pat. Off. . |
| 478984 | 4/1992 | European Pat. Off. . |
| 85 06492 | 4/1985 | France . |
| 42 35 953 | 4/1994 | Germany . |
| 9511322 | 4/1995 | WIPO . |

OTHER PUBLICATIONS

Patent Abstracts of Japan, vol. 15, No. 211, C–836, abstract of JP, A, 3–61374 (Idemitsu Petrochem Co. Ltd0, Mar. 18, 1991.

Coating Technology Based on the Vacuum Arc—A Review, David M. Sanders et al., IEEE Transactions on Plasma Science, vol.18, No. 6, Dec. 1990, pp. 883–894.

Cu and Zn films produced with an anodic vacuum arc, Vacuum, vol. 41, Nos. 4–6, Great Britain, 1990, pp. 1393 to 1395, M. Mausbach, et al.

(List continued on next page.)

Primary Examiner—Daniel J. Jenkins
Attorney, Agent, or Firm—Young & Thompson

[57] ABSTRACT

An apparatus for generation of a linear arc discharge for plasma processing, particularly for processing on surfaces of solid substrates, installed in a reactor held at gas pressures below $5 \times 10^4$ Pa and powered by a generator of alternating current (10), includes: at least one pair of a first electrode plate (1) and a second electrode plate (2) placed opposite to each other at a distance exceeding 0.4 mm and connected to the same pole of the generator which has counter pole connected to a counter electrode (3), a magnetic field produced by magnets (4) for development of a linear hot zone (5) on the first electrode plate and a linear hot zone (6) on the second electrode plate, which have a component of at least $10^{-3}$ Tesla across the slit between these electrode plates, an ionized environment (7) containing a working gas (8) involved between the electrode plates and having an electrical contact with the electrode plates where an arc discharge (9) is generated and with the counter electrode.

20 Claims, 3 Drawing Sheets

OTHER PUBLICATIONS

2. Bohrs Heliumlinien (first report about hollow cahtodes), Ann. Physik 50, F. Paschen, pp. 901–940.

Hollow Cathode Arcs, Jean–Loup Delcroix, Advances in Electronics and Electron Physics 35, 1974, pp. 87–190.

A critical review of spectral and related physical properties of the hollow cathode discharge, M. E. Pillow, Spectrochimica Acta, vol. 36B, 1981, pp. 821–843.

Hollow Cathode Discharges, Radu Marvodineanu, Journal of Research of the National Bureau of Standards, vol. 89, No. 2, Mar.–Apr. 1984, pp. 143–185.

Handbook of Plasma Processing Technology, Stephen M. Rossnagel, et al., Noyes Publications, Park Ridge, New Jersey, U.S.A., 1990, Chapter 18, pp. 419–446.

Hollow Cathode Reactive Sputter Etching—A New High-–Rate Process, Chris M. Horwitz, American Institute of Physics, Appl. Phys. Lett. vol. 43, Nov. 15, 1983, pp. 977–979.

New Way FCR High–Rate a–Si Deposition, Ladislav Bardos, et al., Journal of Non–Crystalline solids, 97 & 98, North–Holland, Amsterdam, 1987, pp. 281–284.

Rf multipolar plasma for braod and reactive ion beams, C. Lejeune, et al,, Vacuum, vol. 36, Nos. 11 & 12, 1986, Great Britain, pp. 837–840.

Plasma jet dry etching using different electrode configurations, A.M. Barklund, et al., J. Vac. Sci, Technol, A9, May/Jun. 1991, American Vacuum Society, pp. 1055–1057.

Removal of Oil from metals by plasma techniques, A. Belkind, et al., Surface and Coatings Technology, 68/69, Elsevier Science S.A., 1994 pp. 804–808.

The Effect of Magnetic Fields on Hollow Cathode Discharges, Karl H. Schoenbach, Physical Electronics Research Institute, Old Dominion University, Norfolk, VA, Proceedings III, ICCPIG XXI, Ruhr–Universitat Bochum, Sep. 19–24, 1993, pp. 287–296.

Abnormal High Rate Deposition of TiN by the Radio Frequency Plasma Jet System, H. Barankova, et al., Proceedings of the Tenth Symposium on Plasma Processing, Dielectric Science and Technology and Electronics Divisions, Proceedings vol. 94–20, The Electrochemical Society, Inc., Pennington, N.J., pp. 580–589. 1994.

"High Speed Pipe Inner Coating using magnetron hollow-–cathode discharge in a magnetic field", H. Kawasaki, et al., Materials Science and Engineering, A140, 1991, Elsevier Sequoia, The Netherlands, pp. 682–686.

APPARATUS FOR GENERATION OF A LINEAR ARC DISCHARGE FOR PLASMA PROCESSING

FIELD OF THE INVENTION

The present invention relates to an apparatus for generation of a linear arc discharge for plasma processing, particularly for surface processing of solid substrates.

BACKGROUND OF THE INVENTION

Because of high ion density of produced plasmas the arc discharges represent very powerful tools in the plasma processing technology. Arc sources are used for generation of reactive plasmas in a working gas, they can produce plasma which contains particles of sputtered and/or evaporated electrodes, or chemical compounds of these particles with the working gas. Properties of arc discharges depend on energies and densities of the generated ions and electrons, which are affected by the pressure of the working gas. A wide variety of gas plasmatrons use arc discharges at atmospheric pressures, because of simple arrangement without vacuum pumps. However, generation of an arc based on a non-isothermal plasma with controllable ion energies requires low gas pressures. Different types of arc discharges are used for this purpose. Most of them are generated by direct current (DC), high power generators. A typical low pressure source for plasma processing is a cascaded arc (European patent 0297637) which produces a flow of an active plasma in a working gas. Metal ions in plasmas are generated usually from an electrode which is sputtered and/or evaporated by the arc discharge, see D. M. Sanders et al., IEEE Trans. Plasma Sci. 18, 883–894 (1990). The eroded electrode is usually a planar cathode in the DC arc circuit with an electrically grounded anode. The cathode is water cooled and the content of undesirable micro droplets—"macroparticles" present in the evaporated cathode material is reduced by steering the cathode spot motion on the cathode surface. In recent cathodic arc sources the macroparticles are filtered by an auxiliary magnetic field filter (U.S. Pat. No. 5,279,723). The content of macroparticles is usually lower when the consumable electrode is heated up to melting temperature. It is also possible to utilize arc arrangements with a consumable anode instead of the cathode, see e.g. M. Mausbach et al., Vacuum 41, 1393–1395 (1990). Cold consumable cathodes are of limited size and require the magnet filtering, which limits possibility of scaling these sources up. Consumable electrodes containing liquid metal crucibles can be installed only in restricted positions. Most arc sources require an additional switch to start the discharge.

A generation of an arc discharge is very efficient in hollow cathodes. The principle of the hollow cathode gas discharge generated by a direct current has been reported first by F. Paschen, Ann. Physik 50, 901–940 (1916). From that time a great number of investigations about this discharge have been reported, see reviews e.g. J-L. Delcroix and A. R. Trindade, Advances in Electronics and Electron Phys. 35, 87–190 (1974), M. E. Pillow, Spectrochimica Acta 36B, no.8, 821–843 (1981), and R. Mavrodineanu, J. Res. Nat. Bureau of Standards 89, no. 2, 143–185 (1984). In DC hollow cathodes an arc discharge can be generated at high DC power. The wall of the hollow cathode must be heated up to high temperatures strongly enhancing thermionic emission of electrons. Moreover, a substantial portion of ions is produced by an erosion of the hollow cathode surface. At these conditions the DC current in the arc circuit grows up rapidly, while the voltage at the cathode falls down to values of the order of the minimum ionizing or minimum exciting potential of the gas or metal vapor. The arc is a self-sustained discharged capable of supporting large currents by providing its own mechanism of electron emission from the negative electrode (see "Handbook of Plasma Processing Technology" ed. by S. Rossnagel et al., Noyes Publ. 1990, Chapter 18 by D. Sanders). Until this condition is not reached the discharge in the hollow cathode cannot be assumed as an arc. It is rather a normal or anomalous glow, even if some parts of the cathode walls are hot, particularly in cathodes fabricated from a thin metal sheet.

Because of high production of electrons even in glow regimes the hollow cathodes have been used since 1971 as both an electron source and the working gas ionization source in plasma processing devices for plasma assisted anode evaporation (se e.g. U.S. Pat. No. 3,562,141). Since 1983 hollow cathode glow discharges generated by alternating current (AC) generators have been developed. Typical frequency of AC generators for this purpose is between 100 kHz and 100 MHz. In particular the radio frequency generators (RF-13.56 MHz and its harmonics) are often used in plasma processing (see e.g. C. M. Horwitz, Appl. Phys. Lett., vol. 43, 1983, p.977, and U.S. Pat. No. 4,521,286). A variety of hollow cathode arrangements were developed using this principle. Hollow cathode systems differ mainly in arrangements of electrodes, the inflow of working gases, etc. A hollow cathode principle can be used for an enhancement of plasma chemical vapor processing in a plane parallel arrangement of processed planar substrates which are at the cathode potential (European patent 0 478 984 A1). A cylindrical RF hollow cathode was used for plasma chemical vapor processing (Czech Patent 246,982/PV 4407-85) and for sputtering of the cathode and deposition of films inside hollow substrates and tubes (Czech Pat. Appl. PV3925-90). In RF generated hollow cathodes an anode is the RF plasma itself (a virtual anode) which is in contact with a real counter electrode connected to the RF generator (Bárdo‰ et al., J. Non Cryst. Solids 97/98, 281 (1987). The multiple cylindrical RF hollow cathode (19 tubes together) with closed bottom parts in a multi-cusp magnetic field has been used as an effective 175 mm diameter ion beam source, see C. Lejeune et al., Vacuum 36, 837 (1985) and in French Patent Application No. 85 06 492 (1985). The multiple RF hollow cathode (5 holes) in a linear distribution has been reported by A. M. Barklund et al., J. Vac. Sci. Technol. A9, 1055 (1991), (see also Czech Patent 246,982). The linear array of 64 DC or AC powered cylindrical hollow cathodes in an axial magnetic field providing about 40 cm long distributed discharge has been reported recently by A. Belkind et al., ICMCTF'94, poster session, San Diego 1994 (will appear in Proceedings in Surface Coat. Technol. (1994)). In this work an axial magnetic field of 0.025 Tesla was used to extract the plasma beyond the confinements of hollow cathodes. Effects of magnetic fields of different inductions have been often reported in hollow cathodes, see e.g. review by K. H. Schoenbach, invited paper at ICPIG 21, Bochum 1993, Proc. III, pp. 287–296. Because of a magnetic confinement effect the magnetic fields are often used for low pressure discharge regimes in hollow cathodes. Most of the systems mentioned above use glow discharge in a cylindrical hollow cathode. At sufficiently high power in an arc regime the production of metal ions from the hollow cathode wall is enough for a self sustained discharge without any other working gas (L. Bárdo‰ et al., Swedish Patent Application No. 9303426-2, International Patent Application PCT/SE9/00959). An arc hollow cathode regime in gas which contains a reactive component can be used for very high rate reactive deposition of films based on an enhanced production of the cathode metal particles. This deposition can be even faster than corresponding non-reactive deposition of pure metal film (see H. Baránková et al., Proc. 10th Symp. on Plasma Processing, Electrochem. Soc. Spring Meet., San Francisco 1994, Proc. Vol. 94-20, G. S. Mathad and D. W. Hess, eds., pp. 580–591). Most of the hollow cathode arrangements utilize cylindrical cathodes or small plane parallel cathode disks with a cylindrical anode around them. In general, the hollow cathode systems are of very limited dimensions. This can be an advantage for inside tube plasma processing (H. Kawasaki et al., Mat. Sci. Engineer. A140, 682 (1991)). Similarly to filtered arc discharges the discrete arcs produced by small size hollow cathodes are of limited possibility of scaling up. Linear arrays of multiple cathodes cannot produce uniform linear discharge and they depend on function of each particular discharge.

SUMMARY OF THE INVENTION

An object of present invention is therefore to overcome the above described prior art discoveries and drawbacks and to provide an apparatus for generation of a linear arc discharge for plasma processing.

In a first aspect according to the present invention an apparatus for generation of a linear arc discharge for plasma processing, particularly for surface processing of solid substrates, installed in a reactor at gas pressures below $5 \times 10^4$ Pa and powered by a generator of alternating current and/or pulsing power, consisting of at least one pair of a first electrode plate and a second electrode plate placed opposite to each other at a distance exceeding 0.4 mm and connected to the same pole of the generator which has a counter pole connected to a counter electrode, a magnetic field produced by magnets for development of a linear hot zone on the first electrode plate and a linear hot zone on the second electrode plate, having a component of at least $10^{-3}$ Tesla across the slit between the electrode plates, an ionized environment containing a working gas involved between the electrode plates and the ionized environment having electrical contact with the electrode plates where an arc discharge is generated and with the counter electrode.

In a second aspect according to the present invention the electrode plates are fixed on a main electrode body connected with a tuning system which enables both tuning of the distance between the electrode plates by transversal tuning elements and tilting of the electrode plates by angular tuning elements.

In a third aspect according to the present invention an outer cartridge protects an outflow of the working gas at side parts of the main electrode body and the tuning system, whereby the working gas is admitted through a gas flow distributor for optimum distribution of the working gas in the slit between the electrode plates.

In a fourth aspect according to the present invention the counter electrode is represented by a part of the reactor chamber walls and/or by a substrate holder with substrates to be processed by the arc discharge.

In a fifth aspect according to the present invention positions of the magnets are tuned with respect to the electrode plates by a tuner and distribution of the magnetic field along and across the electrode plates is tuned by the magnets and/or by additional magnets.

In a sixth aspect according to the present invention the first electrode plate and/or the second electrode plate are equipped by an additional side part.

In a seventh aspect according to the present invention the first electrode plate and the second electrode plate are fabricated from different materials.

BRIEF DESCRIPTION OF THE DRAWINGS

The objects, features and advantages of present invention as mentioned above will become apparent from the description of the invention given in conjunction with the following drawings, wherein.

DETAILED DESCRIPTION

Figure 1:
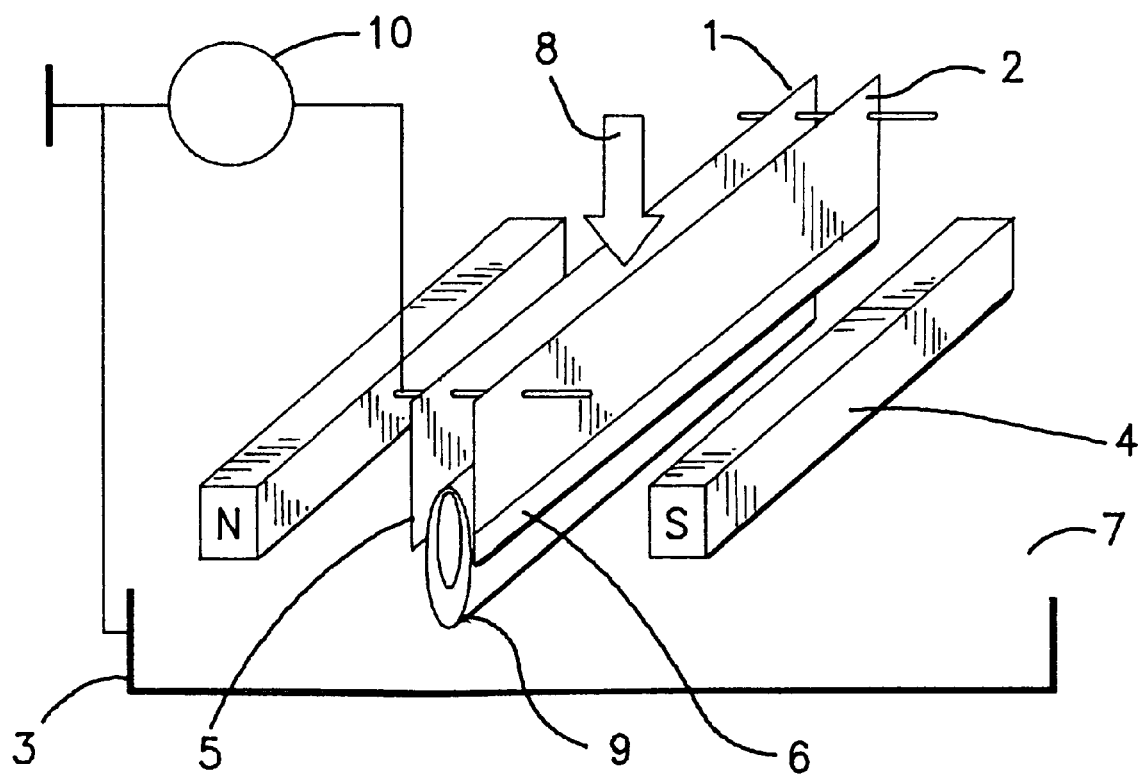
FIG. 1 is a schematic view of a first embodiment according to the present invention showing a principle example of an apparatus for generator of a linear arc discharge for plasma processing, particularly for surface processing of solid substrates.

Referring to FIG. 1, a first embodiment of the apparatus for generation of a linear arc discharge for plasma processing according to the present invention will be described. First an electrode plate 1 and a second electrode plate 2 are placed opposite to each other at a distance exceeding 0.4 mm. This is important to avoid an undesirable mechanical contact of hot surfaces of electrode plates during operation of the apparatus. Both electrode plates are connected to the same pole of the generator 10 of an alternating current and/or pulsing power supply which has a counter pole connected to a counter electrode 3. For generation of a non-thermal plasma the electrodes are installed in a reactor at gas pressures below $5 \times 10^4$ Pa. A magnetic field which has a component of at least $10^{-2}$ Tesla across the slit between electrode plates is produced by magnets 4 and used for development of a linear hot zone 5 on the first electrode plate and for a linear hot zone 6 on the second electrode plate. These hot zones are formed due to an ion bombardment in a hollow cathode discharge which appears between the electrode plates in an ionized environment 7 containing a working gas 8 and having an electrical contact with the electrode plates, particularly with their surfaces facing each other, and with the counter electrode. This ionized environment represents an initial glow discharge necessary for the start of an arc discharge 9 in the apparatus according to the invention. The hot zones on both electrode plates are generated at the power level which depends on the size of electrode plates, on the gas pressure, on the material of the electrode plate, etc. Hot zones are generated in selected areas where substantial part of the ion current is focused by the magnetic field. Losses of electrons swinging between repelling potentials at opposite plates can also be reduced by the magnetic confinement, which can cause an enhanced local ionization. The hot zones enhance also a thermionic electron emission from electrode plates and enable a start of the linear arc discharge. The start of the arc proceeds at a particular threshold power from an initial hollow cathode glow and without any external ignition tools. The linear uniformity of the arc discharge depends on a uniform temperature along the hot zone at electrode plates, which depends on the heat conductivity of the plate material and it can be balanced by the magnetic field.

EXAMPLES

Figure 2:
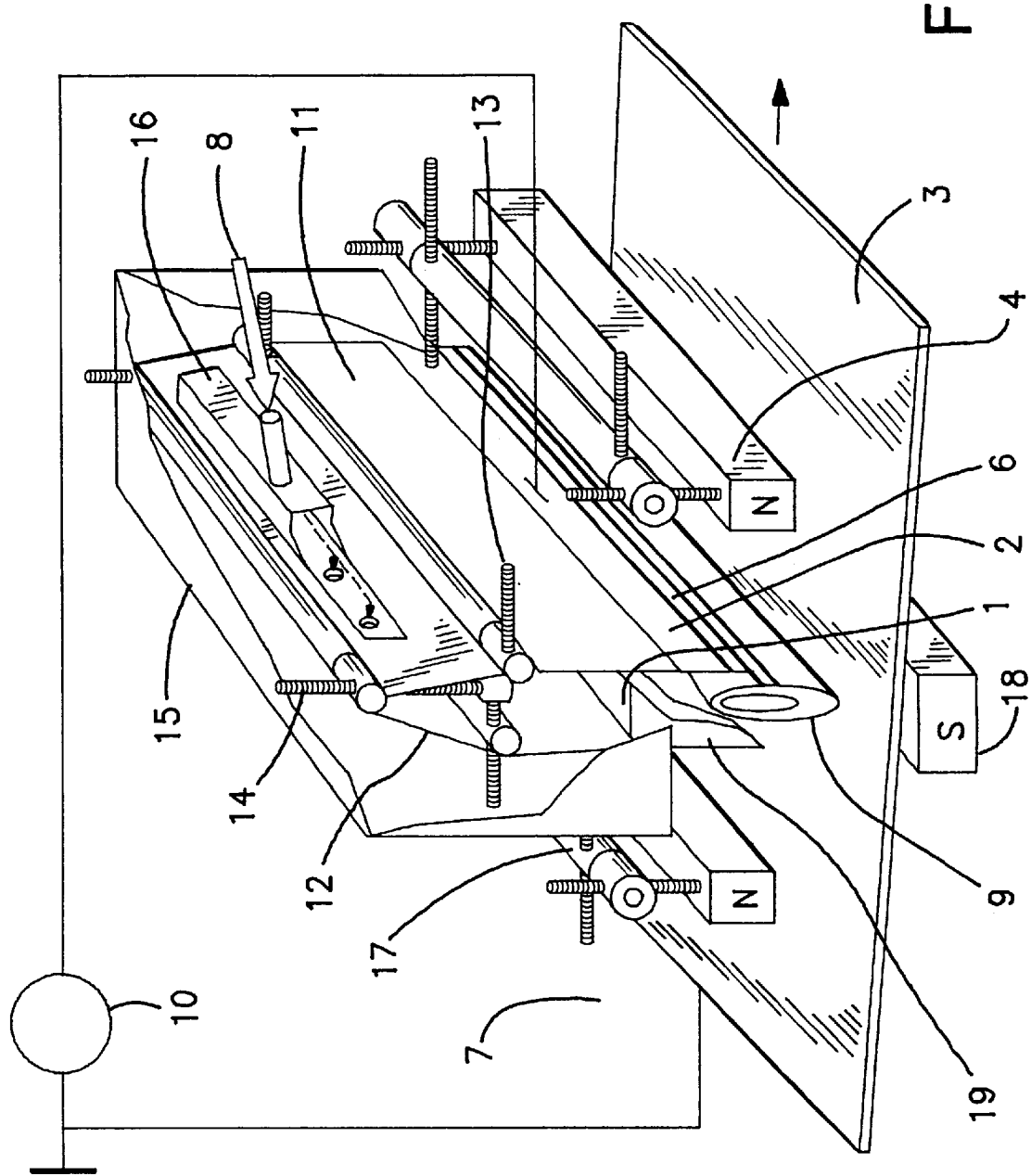
FIG. 2 is a schematic view of a second embodiment according to the present invention showing an example of an apparatus for generation of a linear arc discharge for plasma processing, as of FIG. 1.

Referring to FIG. 2 will be described in a schematic view an example of a preferred embodiment of the apparatus as shown in FIG. 1 for generation of a linear arc discharge for plasma processing according to the present invention. The electrode plates are fixed on the main electrode body 11 connected with a tuning system 12 which enables both tuning of a distance between the electrode plates by transversal tuning elements 13 and tilting of the electrode plates by angular tuning elements 14. Tuning of the distance between plates enables optimization of the linear arc discharge 9 at different parameters, e.g. gas pressure, power, material of the electrode plates, magnetic induction, geometry of the substrate, etc. Tuning of the angular positions of the electrode plates can compensate eventual thermal deformations of the electrode plates due to the hot zones. For example the typical temperature in hot zones on Ti electrode plates exceeds 1350° C. To obtain high temperature in the hot zones the electrode plates are not equipped with any intentional cooling. The electrode plate cooling by a heat conduction through a mechanical contact with the main electrode body depends on the plate material and its linear dimensions. An example of dimensions related to a length L of the electrode plate is: $L/15 \leq$ Width (height)$\leq L$ and $L/200 \leq$ Thickness$<<L$. An outer cartridge 15 is used to protect an outflow of the working gas at side parts of both the main electrode body and the tuning system. Depending on the construction and materials used an external cooling can be applied to the outer cartridge, or to the main electrode body, or to the tuning system, or to all these parts. It is also necessary to provide cooling of the magnets to avoid their demagnetization in case that permanent magnets are used. The working gas is admitted through a gas flow distributor 16, which provides optimal distribution of the gas in the slit between the electrode plates. The counter electrode 3 in the example shown in FIG. 2 is represented by a substrate to be processed by the arc discharge. Both positions and magnetic induction of magnets affect the location and the temperature of the hot zones at the electrode plates thereby affecting conditions for the linear arc discharge. Positions of magnets are tuned with respect to the electrode plates by a tuner 17 and a distribution of the magnetic field is tuned by proper selection of the induction values of magnets 4 and by additional magnets 18. Additional magnets can "open" the magnetic field thereby enhancing the extraction of plasma from the slit between electrode plates towards the substrate. To suppress inhomogeneity of parameters of the linear arc discharge at both ends of the electrode plates the first electrode plate and/or a second electrode plate will be equipped by an additional side part (19). This inhomogeneity can be reduced also by proper shaping of the magnetic field at both ends of the electrode plates.

Referring to FIG. 3 an embodiment according to the present invention of the apparatus as shown in FIG. 1 for generation of a linear arc discharge for plasma processing is described in three different examples of arrangements of several pairs of the electrode plates assembled together into a multiple system for generation of a multiple linear arc discharge according to the present invention.

Figure 3A:
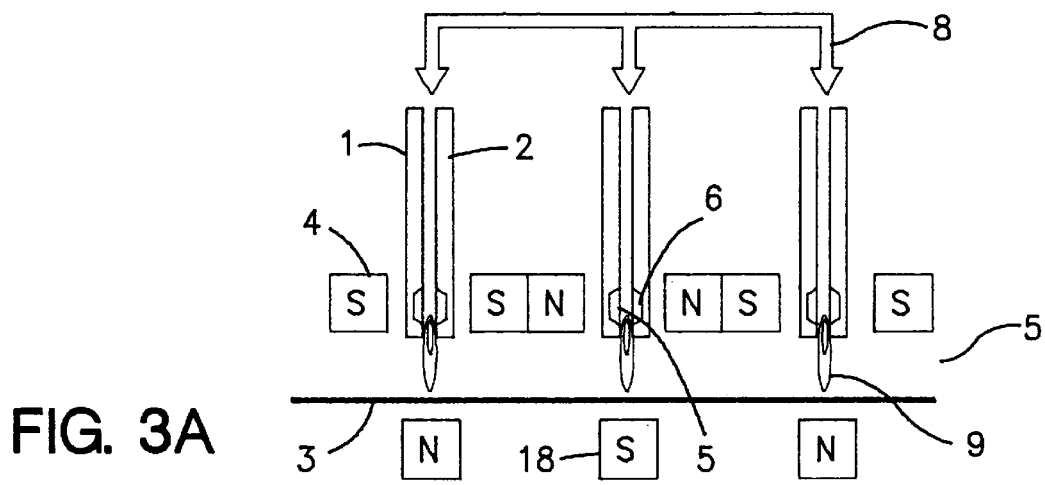
FIGS. 3(a), (b) and (c) are a schematic sectional view of a third embodiment according to the present invention showing three different examples of arrangements of the apparatus as shown in FIG. 1, comprising several pairs of electrode plates associated together into a multiple system for generation of multiple linear arc discharge according to the present invention.

FIG. 3(a) describes a schematic sectional view of three pairs of the first electrode plate 1 and the second electrode plate 2 arranged side by side in the independent magnetic fields, produced by magnets 4 and by additional magnets 18. The ionized environment 5, e.g. an RF plasma, is shared by each pair of electrode plates. The counter electrode 3, e.g. the processed substrate, is also common for all three systems, which allows an increase of processing rate. The working gas 8 can be identical for all three systems, however different gases can be used in each particular system. Then the linear hot zones 5 and 6 corresponding to the respective electrode plates 1 and 2 can exhibit both a different shape and a different temperature in respective parts of the assembled system. This causes different properties of linear arc discharge 9 generated in the respective system, which could be desirable for selected applications. Moreover individual pairs of electrode plates can be powered providing an auxiliary electrical bias relative to each other. In this case both the geometry and the plasma parameters of respective linear arc discharges 9 can be affected.

Figure 3B:
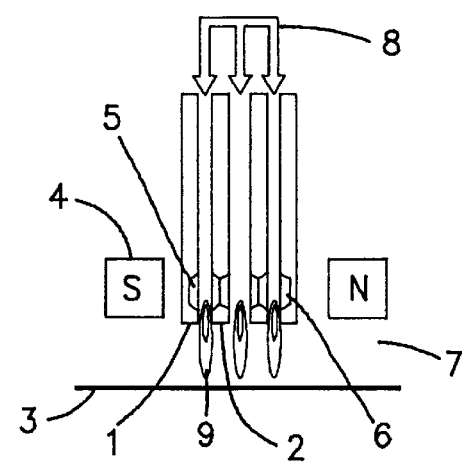

FIG. 3(b) describes a schematic sectional view of three pairs of the first electrode plate 1 and the second electrode plate 2 arranged side by side as in FIG. 3(a), however the second electrode plate of a preceding pair of electrode plates is identical with the first electrode plate in the following pair of plates. In this arrangement the magnetic field produced by magnets 4 is shared by all systems. Parameters of hot zones 5 and 6 on individual electrode plates which are shared by neighboring systems differ from those at the outer sides of the assembly. An enhanced temperature of linear hot zones in inner plates can be favorably utilized in case of materials with high melting temperature in a system with different materials of the electrode plates.

Figure 3C:
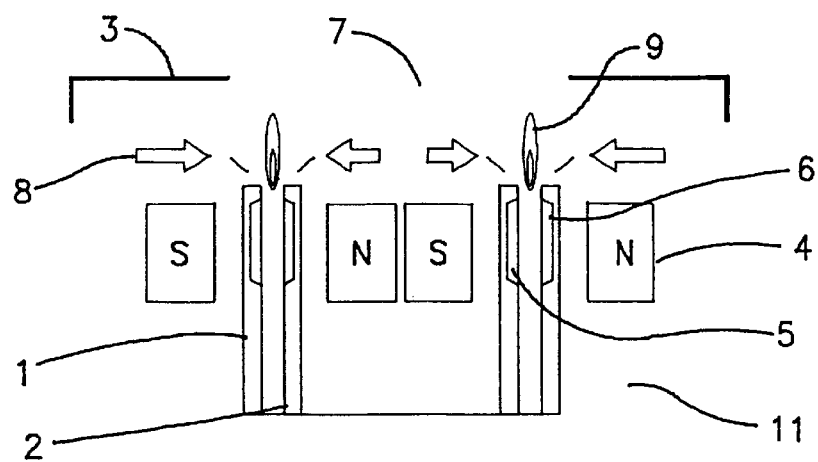

FIG. 3(c) describes a schematic sectional view of two pairs of electrode plates arranged in a main electrode body 11. In this arrangement the slit between the first electrode plate 1 and the second electrode plate 2 is closed at a bottom side and the working gas 8 is introduced into the slit from the ionized environment 7. In this case the electrode plates can be shaped into a hollow target, for example, of a cylindrical or race-track form, and it can be installed in a geometry similar to planar magnetrons. The working gas can be introduced also from the bottom side using channels installed in the main electrode body 11.

The apparatus according to the present invention enables a continuous supply of the material consumed from the electrode plates for the plasma processing by changes of relative position of the electrode plates with respect to position of linear hot zones and the counter electrode.

A linear arc discharge in the apparatus according to the present invention can be generated also by DC instead of AC power. However, the DC generation can be of a limited use in the case of deposition of dielectric films. In DC generation the corresponding anode in close vicinity of the cathode must be arranged. In an AC generation the role of the anode can be fulfilled by the AC plasma itself.

A linear arc discharge in the apparatus according to the present invention can be generated also at gas pressures exceeding $5 \times 10^4$ Pa. However, at high pressures the plasma processing is limited by very short mean free paths of ions and electrons and a maintenance of a uniform linear discharge is more complicated.

In the apparatus according to the present invention a high surface temperature of linear hot zones at the electrode plates used for the maintenance of the linear arc discharge can allow arc regimes with a reduced formation of droplets from the cathode material in deposited films.

In the apparatus according to the present invention the electrode plates can be sectioned, or shaped into different non-planar profiles. Individual plates can also be assembled from different materials.

The apparatus according to the present invention can be used also for plasma processing in an ordinary hollow cathode regime without the linear arc discharge.

We claim:

1. An apparatus for generation of a linear arc discharge for plasma processing, particularly for surface processing of solid substrates, installed in a reactor at gas pressures below $5 \times 10^4$ Pa and powered by a generator of alternating current and/or pulsing power (10), characterized in at least one pair of a first electrode plate (1) and a second electrode plate (2) placed opposite to each other at a distance exceeding 0.4 mm and connected to the same pole of the generator which has a counter pole connected to a counter electrode (3);

a magnetic field produced by magnets (4) for development of a linear hot zone (5) on said first electrode plate and a linear hot zone (6) on said second electrode plate, having a component of at least $10^{-3}$ Tesla across the slit between said electrode plates;

an ionized environment (7) containing a working gas (8) involved between said electrode plates and said ionized environment having an electrical contact with said electrode plates where an arc discharge (9) is generated and with said counter electrode.

2. The apparatus according to claim 1, characterized in that said electrode plates are fixed on a main electrode body (11) connected with a tuning system (12) which enables both tuning of the distance between said electrode plates by transversal tuning element (13) and tilting of said electrode plates by angular tuning elements (14).

3. The apparatus according to claim 1, characterized in an outer cartridge (15) which protects an outflow of said working gas at side parts of said main electrode body and said tuning system, whereby said working gas is admitted through a gas flow distributor (16) for optimum distribution of said working gas in the slit between said electrode plates.

4. The apparatus according to claim 1, characterized in that said counter electrode is represented by a part of a reactor chamber wall and/or by a substrate holder with substrates to be processed by said arc discharge.

5. The apparatus according to claim 1, characterized in that positions of said magnets are tuned with respect to said electrode plates by a tuner (17) and distribution of the magnetic field along and across said electrode plates is tuned by said magnet and/or by additional magnets (18).

6. The apparatus according to claim 1, characterized in that said first electrode plate and/or said second electrode plate are equipped by an additional side part (19).

7. The apparatus according to claim 1, characterized in that said first electrode plate and said second electrode plate are fabricated from different materials.

8. The apparatus according to claim 2, characterized in an outer cartridge (15) which protects an outflow of said working gas at side parts of said main electrode body and said tuning system, whereby said working gas is admitted through a gas flow distributor (16) for optimum distribution of said working gas in the slit between said electrode plates.

9. The apparatus according to claim 2, characterized in that said counter electrode is represented by a part of a reactor chamber wall and/or by a substrate holder with substrates to be processed by said arc discharge.

10. The apparatus according to claim 9, characterized in that said counter electrode is represented by a part of a reactor chamber wall and/or by a substrate holder with substrates to be processed by said arc discharge.

11. The apparatus according to claim 2, characterized in that positions of said magnets are tuned with respect to said electrode plates by a tuner (17) and distribution of the magnetic field along and across said electrode plates is tuned by said magnets and/or by additional magnets (18).

12. The apparatus according to claim 3, characterized in that positions of said magnets are tuned with respect to said electrode plates by a tuner (17) and distribution of the magnetic field along and across said electrode plates is tuned by said magnets and/or by additional magnets (18).

13. The apparatus according to claim 4, characterized in that positions of said magnets are tuned with respect to said electrode plates by a tuner (17) and distribution of the magnetic field along and across said electrode plates is tuned by said magnets and/or by additional magnets (18).

14. The apparatus according to claim 2, characterized in that said first electrode plate and/or said second electrode plate are equipped by an additional side part (19).

15. The apparatus according to claim 3, characterized in that said first electrode plate and/or said second electrode plate are equipped by an additional side part (19).

16. The apparatus according to claim 4, characterized in that said first electrode plate and/or said second electrode plate are equipped by an additional side part (19).

17. The apparatus according to claim 5, characterized in that said first electrode plate and/or said second electrode plate are equipped by an additional side part (19).

18. The apparatus according to claim 2, characterized in that said first electrode plate and said second electrode plate are fabricated from different materials.

19. The apparatus according to claim 3, characterized in that said first electrode plate and said second electrode plate are fabricated from different materials.

20. The apparatus according to claim 4, characterized in that said first electrode plate and said second electrode plate are fabricated from different materials.

* * * * *